(12) United States Patent
Tong et al.

(10) Patent No.: US 11,486,955 B2
(45) Date of Patent: Nov. 1, 2022

(54) TEST SYSTEM

(71) Applicant: SHENZHEN GOODIX TECHNOLOGY CO., LTD., Shenzhen (CN)

(72) Inventors: Tianya Tong, Shenzhen (CN); Danyu Shen, Shenzhen (CN); Haihong Song, Shenzhen (CN)

(73) Assignee: SHENZHEN GOODIX TECHNOLOGY CO., LTD., Shenzhen (CN)

( * ) Notice: Subject to any disclaimer, the term of this patent is extended or adjusted under 35 U.S.C. 154(b) by 356 days.

(21) Appl. No.: 16/941,761

(22) Filed: Jul. 29, 2020

(65) Prior Publication Data

US 2020/0355777 A1 Nov. 12, 2020

Related U.S. Application Data

(63) Continuation of application No. PCT/CN2018/113081, filed on Oct. 31, 2018.

(51) Int. Cl.
*G01R 31/28* (2006.01)
*G01R 35/02* (2006.01)

(52) U.S. Cl.
CPC ......... *G01R 35/02* (2013.01); *G01R 31/2889* (2013.01)

(58) Field of Classification Search
CPC .... G01R 35/02; G01R 31/28; G01R 31/2889; G01R 31/2886; G01R 31/31905; G01R 31/31924
See application file for complete search history.

(56) References Cited

U.S. PATENT DOCUMENTS

| 5,399,975 | A | * | 3/1995 | Laing | G01R 31/315 |
|---|---|---|---|---|---|
| | | | | | 324/763.01 |
| 2009/0091331 | A1 | * | 4/2009 | Sonnhueter | G01R 31/31926 |
| | | | | | 324/537 |

FOREIGN PATENT DOCUMENTS

| CN | 1714295 A | 12/2005 |
|---|---|---|
| CN | 201637817 | 11/2010 |

(Continued)

OTHER PUBLICATIONS

Xu_CN-203012068 U_2013_English Translation with Figures.*

(Continued)

*Primary Examiner* — Jermele M Hollington
*Assistant Examiner* — Suresh K Rajaputra
(74) *Attorney, Agent, or Firm* — Emerson, Thomson & Bennett, LLC; Roger D. Emerson; Warren A. Rosborough

(57) ABSTRACT

A test system is provided. The system includes a first test apparatus and a second test apparatus. A device power supply of the first test apparatus (ATE) is electrically connected with a device under test (DUT) through a driving branch (F) and a detecting branch (S), the driving branch (F) being configured to provide an original driving current to the DUT b the device power supply during testing, and the detecting branch (S) being configured to detect an effective driving current reaching the DUT. The second test apparatus includes a first voltage drop branch, the first voltage drop branch is connected to the detecting branch (S), and a voltage drop detected by the driving branch (F) is used to determine an effectiveness of an electrical connection formed between the driving branch and the device under test, and an electrical connection formed between the detecting branch (S) and the DUT.

18 Claims, 3 Drawing Sheets

(56) References Cited

FOREIGN PATENT DOCUMENTS

| | | | |
|---|---|---|---|
| CN | 102121955 A | 7/2011 | |
| CN | 102723935 | 10/2012 | |
| CN | 203012068 U | * 6/2013 | ............ G01R 31/02 |
| CN | 203012068 U | 6/2013 | |
| CN | 204086438 U | 1/2015 | |
| CN | 104569661 A | 4/2015 | |
| CN | 105717354 | 6/2016 | |
| CN | 106104782 A | 11/2016 | |
| CN | 206788316 | 12/2017 | |
| CN | 207263883 U | 4/2018 | |
| CN | 107995951 A | 5/2018 | |
| CN | 102495354 | 6/2021 | |
| EP | 0575061 A1 | 12/1993 | |
| JP | H04329651 A | 11/1992 | |
| JP | 2012021785 A | 2/2012 | |
| WO | 2009040344 A1 | 4/2009 | |

OTHER PUBLICATIONS

Ting Li et al., "High-energy asymmetric electrochemical capacitors based on oxides functionalized hollow carbon fibers electrodes", http://dx.doi.org/10.1016/j.nanoen.2016.09.023, available online Sep. 17, 2016, 9 pages, Elsevier Ltd.

* cited by examiner

TEST SYSTEM

CROSS-REFERENCE TO RELATED APPLICATIONS

The present application is a continuation of international application No. PCT/CN2018/113081, filed on Oct. 31, 2018, which is hereby incorporated by reference in its entirety.

TECHNICAL FIELD

Embodiments of the present disclosure relate to the field of circuit technologies, and specifically to providing a test system for integrated circuit.

BACKGROUND

When using automated test equipment (ATE) to test an integrated circuit (IC), the device power supply of the automated test equipment (ATE) is often electrically connected to a device under test (DUT). In order to realize the electrical connection with the device under test (DUT), the device power supply is usually configured with a driving line (also referred to as FORCE line, hereinafter referred to as F line) and a detection line (also referred to as SENSE line, hereinafter referred to as S line). The F line is mainly used to transmit a driving current to the device under test (DUT), and the S line is mainly used to detect whether an actual driving voltage reaching the device under test (DUT) meets the voltage required for the normal operation of the device under test (DUT).

As can be seen from the above, in order to ensure that during the test, the driving current is transmitted to the device under test (DUT) through the F line, and whether the actual driving voltage reaching the device under test (DUT) meets the voltage required for the normal operation of the device under test (DUT) is detected through the S line, once the S line does not form an effective electrical connection with the device under test (DUT), it may not be able to detect whether the actual driving voltage reaching the device under test (DUT) meets the voltage required for the normal operation of the device under test (DUT). Therefore, it is necessary to provide a technical solution to test whether an effective electrical connection is formed between the F line, the S line and the device under test (DUT).

SUMMARY

In view of this, one of the technical problems addressed by embodiments of the present disclosure is to provide a test system, to overcome the above defects in the prior art.

An embodiment of the present disclosure provides a test system, including: a first test apparatus and a second test apparatus, wherein a device power supply of the first test apparatus is electrically connected with a device under test through a driving branch and a detecting branch, the driving branch being configured to provide an original driving current to the device under test by means of the device power supply during testing, and the detecting branch being configured to detect an effective driving current reaching the device under test; and the second test apparatus includes a first voltage drop branch, the first voltage drop branch is connected to the detecting branch, and a voltage drop detected by the driving branch is used to determine an effectiveness of an electrical connection formed between the driving branch and the device under test, and an electrical connection formed between the detecting branch and the device under test.

Alternatively, in an embodiment of the present disclosure, the device under test includes a second voltage drop branch and the original driving current is negative, when the voltage drop detected by the driving branch is a voltage drop of the first voltage drop branch, it is determined that an effective electrical connection is formed between the detecting branch and the device under test.

Alternatively, in an embodiment of the present disclosure, the device under test includes a second voltage drop branch and the original driving current is negative, when the voltage drop detected by the driving branch is a voltage drop of the second voltage drop branch in the device under test, it is determined that no effective electrical connection is formed between the detecting branch does and the device under test.

Alternatively, in an embodiment of the present disclosure, the device under test includes a second voltage drop branch and the original driving current is negative, when the voltage drop detected by the driving branch is a clamping voltage of the first test apparatus, it is determined that no effective electrical connection is formed between the driving branch and the device under test.

Alternatively, in an embodiment of the present disclosure, the device under test does not include a second voltage drop branch and the original driving current is negative, when the voltage drop detected by the driving branch is a clamping voltage of the first test apparatus, it is determined that no effective electrical connection is formed between the driving branch and the device under test, or no effective electrical connection is formed between the detecting branch and the device under test.

Alternatively, in an embodiment of the present disclosure, the first voltage drop branch includes a first switching device and a second switching device, an anode of the first switching device is grounded, a cathode of the first switching device is connected to one end of the second switching device, and the other end of the second switching device is connected to the detecting branch.

Alternatively, in an embodiment of the present disclosure, the device under test includes a second voltage drop branch and the original driving current is positive, when the voltage drop detected by the driving branch is a voltage drop of the first voltage drop branch, it is determined that an effective electrical connection is formed between the detecting branch and the device under test.

Alternatively, in an embodiment of the present disclosure, the device under test includes a second voltage drop branch and the original driving current is positive, when the voltage drop detected by the driving branch is a voltage drop of the second voltage drop branch in the device under test, it is determined that no effective electrical connection is formed between the detecting branch and the device under test.

Alternatively, in an embodiment of the present disclosure, the device under test includes a second voltage drop branch and the original driving current is positive, when the voltage drop detected by the driving branch is a clamping voltage of the first test apparatus, it is determined that no effective electrical connection is formed between the driving branch and the device under test.

Alternatively, in an embodiment of the present disclosure, the device under test does not include a second voltage drop branch and the original driving current is positive, when the voltage drop detected by the driving branch is a clamping voltage of the first test apparatus, it is determined that no effective electrical connection is formed between the driving branch and the device under test, or no effective electrical connection is formed between the detecting branch and the device under test.

Alternatively, in an embodiment of the present disclosure, the first voltage drop branch includes a first switching device and a second switching device, a cathode of the first switching device is grounded, an anode of the first switching device is connected to one end of the second switching device, and the other end of the second switching device is connected to the detecting branch.

Alternatively, in an embodiment of the present disclosure, the second test apparatus is provided on a loadBoard for building a function/performance test of a chip.

In the embodiments of the present disclosure, since the test system includes a first test apparatus and a second test apparatus, the device power supply of the first test apparatus is electrically connected with a device under test through a driving branch and a detecting branch, the driving branch is configured to provide an original driving current to the device under test by means of the device power supply during testing, and the detecting branch is configured to detect an effective driving current reaching the device under test; and the second test apparatus includes a first voltage drop branch, the first voltage drop branch is connected to the detecting branch, and a voltage drop detected by the driving branch is used to determine an effectiveness of an electrical connection formed between the driving branch and the device under test, and an electrical connection formed between the detecting branch and the device under test.

BRIEF DESCRIPTION OF THE DRAWINGS

Hereinafter, some specific embodiments of the embodiments of the present disclosure will be described in detail by way of example rather than limiting with reference to the accompanying drawings. The same reference numerals in the accompanying drawings designate the same or similar components or parts. Those skilled in the art should appreciate that these accompanying drawings are not necessarily drawn to scale. In the accompanying drawings.

DETAILED DESCRIPTION OF EMBODIMENTS

Figure 1:
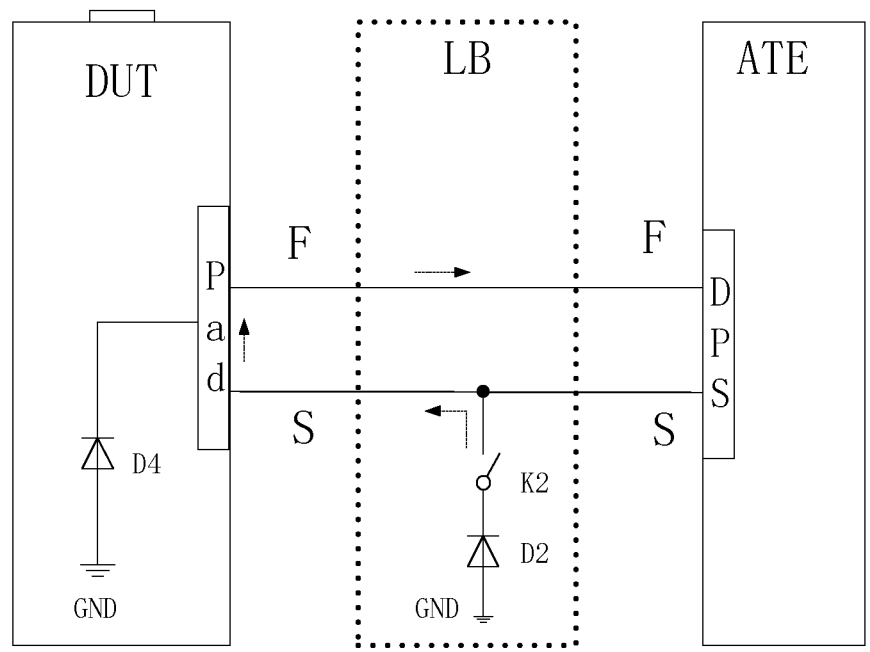
FIG. 1 is a schematic structural diagram of a test system according to Embodiment 1 of the present disclosure.

In order to implement any technical solution of the embodiments of the present disclosure, it is not necessary to achieve all the above advantages at the same time.

In order to enable those skilled in the art to better understand the technical solutions in the embodiments of the present disclosure, the technical solutions in the embodiments of the present disclosure will be clearly and completely described below in combination with the accompanying drawings in the embodiments of the present disclosure. Obviously, the described embodiments are only a part of the embodiments of the present disclosure, but not all the embodiments. Based on the embodiments in the embodiments of the present disclosure, all other embodiments obtained by those skilled in the art should fall into the protection scope of the embodiments of the present disclosure.

The specific implementation of the embodiments of the present disclosure is further described below with reference to the accompanying drawings of the embodiments of the present disclosure.

In the test system provided in the following embodiments of the present disclosure, the device power supply of the first test apparatus is electrically connected with a device under test through a driving branch and a detecting branch, the driving branch is configured to provide an original driving current to the device under test by means of the device power supply during testing, and the detecting branch is configured to detect an effective driving current reaching the device under test; and the second test apparatus includes a first voltage drop branch, the first voltage drop branch is connected to the detecting branch, and a voltage drop detected by the driving branch is used to determine an effectiveness of the electrical connection formed between the driving branch and the device under test, and an electrical connection formed between the detecting branch and the device under test.

In the following embodiments, the test system is applied to the field of testing integrated circuit IC as an example for description. The corresponding device under test DUT is a chip under test, the first test apparatus is an automated test equipment ATE, and further, the driving branch is the F line, and the detecting branch is the S line. When testing the chip under test, the F line and the S line should be in effective electrical connection with the solder pin (also referred to as PAD) on the chip under test.

The second test apparatus may be independent of a loadBoard (LB for short). However, in consideration of cost and compactness, the second test apparatus is directly integrated on the loadBoard in the following embodiments. Therefore, it is equivalent to the loadBoard LB not only needs to perform related circuit configuration based on building a function/performance test of the chip, but also configures the circuit based on performing effectiveness detection on the electrical connection formed between the detecting branch and the device under test.

In addition, in the following embodiments, the distinction may be made from the following perspectives:

(1) For example, the first voltage drop branch includes a first switching device (such as a diode) and a second switching device (such as a relay), and the first switching device and the second switching device specifically in different setting positions in the circuit and the different set numbers of the first voltage drop branch are described in examples. In the present embodiment, the second switching device may be a switching device capable of implementing unidirectional conduction performance.

(2) Exemplary description is made with reference to whether the chip under test also includes a second voltage drop branch. If yes, the second voltage drop branch specifically includes a first switching device (such as a diode) is used as an example for description. The diode in the second voltage drop branch may specifically be a diode in an electro-static discharge (ESD) circuit in the chip under test.

(3) The electrical connection effectiveness is tested when a positive-phase driving current (also referred to as the original driving current being positive) is provided to the chip under test by the device power supply of the automated test equipment ATE, or the electrical connection effectiveness is tested when a negative-phase driving current (also referred to as the original driving current being negative) is provided to the chip under test.

FIG. 1 is a schematic structural diagram of a test system according to Embodiment 1 of the present disclosure; in the present embodiment, an electrical connection effectiveness test is performed by providing a negative-phase driving current to the chip under test DUT by the device power supply DPS of the automated test equipment ATE. Correspondingly, the second test apparatus including only one first voltage drop branch (which includes diode D2 and relay K2), at the same time the chip under test DUT including one second voltage drop branch (which includes diode D4) is used as an example for description.

Specifically, as shown in FIG. 1, since the device power supply DPS of the automated test equipment ATE performs the electrical connection effectiveness test when providing the negative-phase driving current to the chip under test, the anode of the diode D2 in the first voltage drop branch is grounded, the cathode of the diode D2 is connected to one end of the relay K2, at the same time, the other end of the relay K2 is connected to the S line; at the same time, the anode of the diode D4 in the second voltage drop branch is grounded and its cathode is connected to the PAD of the chip under test. As mentioned above, to effectively test the chip under test, the F line and the S line must form effective electrical connection with the PAD of the chip under test. In addition, since the first voltage drop branch is connected to the S line, the voltage drop detected by the F line may determine whether the F line, the S line and the PAD of the chip under test DUT actually contact to form an effective electrical connection. Assume that there is no open or short circuit of the diode in the first voltage drop branch, the process is specifically as follows:

The negative-phase driving current is provided to the chip under test by the device power supply (DPS) of the automated test equipment ATE, as shown in FIG. 1, since it is a negative-phase driving current, in the circuit structure of FIG. 1, the current flow actually flows from the chip under test to the device power supply DPS of the automated test equipment, that is, as seen from the left to right arrow when viewed on the F line in FIG. 1; at the same time, the relay K2 in the second test apparatus is controlled by the automated test equipment ATE to be closed, therefore, if the S line is in good contact with the PAD of the chip under test, it may turn on the diode D2 and then a corresponding voltage drop may occur. In order to make the voltage drop detected on the F line be the voltage drop of the diode D2 in the second test apparatus, for the diode D2, when selecting the type, it is preferable to select a diode, when turned on, having a voltage drop smaller than the voltage drop of the diode D4 in the chip under test DUT when turned on. In an actual application scenario, since the diode D4 in the chip under test DUT is often a silicon diode (the voltage drop when turned on is about 0.6V), the diode D2 in the second test apparatus can be a germanium diode (the voltage drop when turned on is about 0.3V).

Further, if a voltage drop (corresponding to a diode-on voltage drop) can be detected on the F line, it indicates that the F line has good contact with the PAD of the chip under test to further form an effective electrical connection, otherwise, it is a voltage drop corresponding to the turning on of a certain diode (D2 or D4) that cannot be detected through the F line.

Further, if the detected voltage drop is equal to the voltage drop of the germanium diode (i.e., D2), it indicates that there is good contact between the S line and the PAD of the chip under test to further form an effective electrical connection; if the detected voltage drop is equal to the voltage drop of the silicon diode (i.e., D4), it indicates that there is no good contact between the S line and the PAD of the chip under test and thus no effective electrical connection is formed. If the detected voltage drop is equal to the clamping voltage of the automated test equipment ATE, it indicates that good contact is not formed between the F line and the PAD of the chip under test, and in this regard as to whether good contact is formed between the S line and the PAD of the chip under test, it remains to be determined. For example, when it is shown that there is no good contact between the F line and the PAD of the chip under test, first, the problem that no good contact is formed between the F line and the PAD of the chip under test DUT may be solved, and then it may be further determined whether good contact is formed between the S line and the PAD of the chip under test DUT.

If the detected voltage drop is equal to the voltage drop of the germanium diode, it indicates that there is good contact between the S line and the PAD of the chip under test to further form an effective electrical connection, the detailed illustration thereof is as follows: in theory, if the S line and the chip under test DUT form an effective electrical connection, but since the voltage drop of the silicon diode is greater than the voltage drop of the germanium diode, the germanium diode is turned on and the silicon diode is not turned on. In this regard, the voltage drop detected by the F line can only correspond to the situation that the germanium diode is turned on, and this situation only occurs when the S line forms an effective electrical connection with the chip under test.

On the contrary, when selecting the type, the diode D2 in the second test apparatus is selected to have a higher voltage drop when turned on than the voltage drop of the silicon diode D4 in the chip under test when turned on, then, when the S line is in good contact with the PAD of the chip under test, the silicon diode D4 in the chip under test is turned on and the diode in the second test apparatus is not turned on, the voltage drop detected by the F line corresponds to the situation that the silicon diode in the chip under test is turned on; and when the S line is not in good contact with the PAD of the chip under test, the voltage drop detected by the F line can only correspond to the situation that the silicon diode in the chip under test is turned on. It can be seen that when the diode in the second test apparatus is selected to have a higher voltage drop when turned on than the voltage drop of the silicon diode in the chip under test when turned on, regardless of whether the S line is in good contact with the PAD of the chip under test, the voltage drop detected by the F line is the voltage drop of the silicon diode in the chip under test. In other words, whether the S line is in good contact with the PAD of the chip under test may not cause a difference in the voltage drop detected by the F line, and further, it may not be possible to determine whether the S line is in good contact with the PAD of the chip under test.

In the above embodiment, the open/short circuit condition of the diode in the first voltage drop branch in the second test apparatus may also be tested. The details are as follows:

When the relay K2 is turned off, a negative-phase driving current is provided through the F line, and the voltage drop detected by the F line is the voltage drop (about 0.6V) of the diode D4 in the second voltage drop branch, indicating that there is no open/short circuit of the diode D4 in the second voltage drop branch; then, when the relay K2 is turned on, the negative-phase driving current is provided through the F line, and the voltage drop detected by the F line is 0V (ground level). In this regard, it is determined that a short circuit in the diode D2 in the second test apparatus occurs.

When the relay K2 is turned on, and the voltage drop detected by the F line is the voltage drop (about 0.6V) of the diode D4 in the second voltage drop branch, it indicates that there is no good contact formed between the S line and the PAD of the chip under test, or the diode D2 in the second test apparatus has an open circuit condition. In this regard, it is preferable to determine whether good contact is formed between the S line and the PAD of the chip under test. For example, a multimeter is used to measure the resistance between the F line and the S line. If the measured resistance is infinite, it indicates that there is no good contact between the S line and the PAD of the chip under test. If the measured resistance is 0 ohms, it indicates that the F line and the S line are in good contact with the PAD. If it is determined that the S line is in good contact with the PAD of the chip under test, it is determined that the diode D2 in the second test apparatus is in short circuit.

Figure 2:
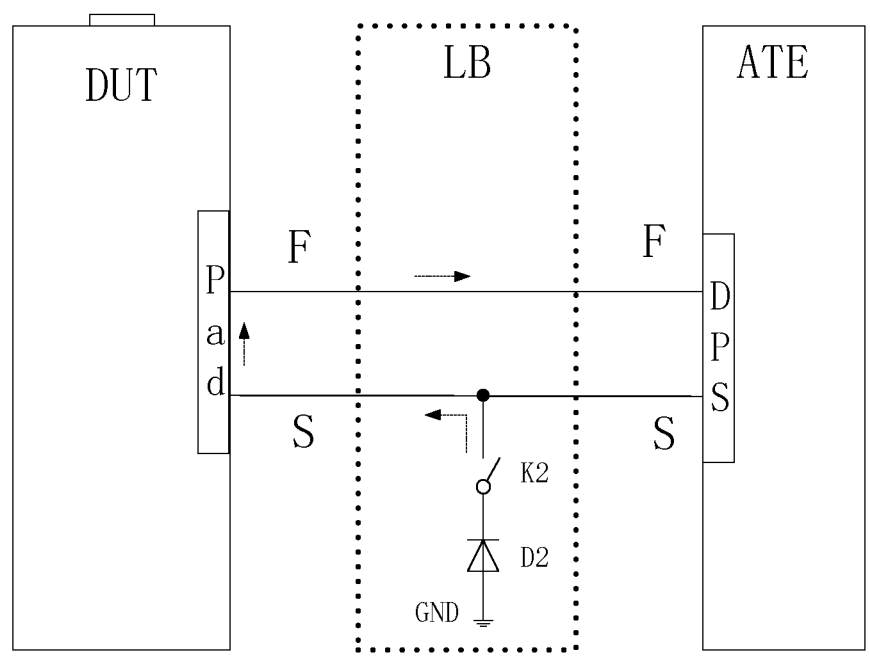
FIG. 2 is a schematic structural diagram of the test system according to Embodiment 2 of the present disclosure.

FIG. 2 is a schematic structural diagram of the test system according to Embodiment 2 of the present disclosure; in the present embodiment, an electrical connection effectiveness test is performed by providing a negative-phase driving current to the chip under test DUT by the device power supply DPS of the automated test equipment ATE. Correspondingly, the second test apparatus includes only one first voltage drop branch. However, different from the embodiment in FIG. 1 described above, the chip under test DUT not including a second voltage drop branch is used as an example for description.

Specifically, as shown in FIG. 2, since the device power supply DPS of the automated test equipment ATE performs the electrical connection effectiveness test when providing the negative-phase driving current to the chip under test DUT, the anode of the diode D2 in the first voltage drop branch is grounded, the cathode of the diode D2 is connected to one end of the relay K2, at the same time, the other end of the relay K2 is connected to the S line. At the same time, as mentioned above, to effectively test the chip under test DUT, the F line and the S line must form effective electrical connection with the PAD of the chip under test DUT. In addition, since the first voltage drop branch is connected to the S line, the voltage drop detected by the F line may determine whether the F line, the S line and the PAD of the chip under test DUT actually contact to form an effective electrical connection. Assume that there is no open or short circuit of the diode in the first voltage drop branch, the process is specifically as follows:

The negative-phase driving current is provided to the chip under test DUT by the device power supply DPS of the automated test equipment ATE, as shown in FIG. 2, since it is a negative-phase driving current, the current flow actually flows from the chip under test DUT to the device power supply DPS of the automated test equipment ATE, that is, as seen from the left to right arrow when viewed on the F line in FIG. 2; at the same time, the relay K2 in the second test apparatus is controlled by the automated test equipment ATE to be closed, therefore, if the S line is in good contact with the PAD of the chip under test DUT, at the same time, if the voltage drop corresponding to the voltage drop of the diode can be detected on the F line, and the voltage drop corresponds to the voltage drop when the diode D2 in the second test apparatus is turned on, it just proves that the S line is in good contact with the PAD of the chip under test DUT, and the F line is in good contact with the PAD of the chip under test DUT, thereby forming the effective electrical connection. On the contrary, if the detected voltage drop is equal to the clamping voltage of the automated test equipment ATE, it indicates that good contact is not formed between the F line and the PAD of the chip under test DUT, and in this regard as to whether good contact is formed between the S line and the PAD of the chip under test DUT, it remains to be determined. For example, when it is shown that there is no good contact between the F line and the PAD of the chip under test DUT, first, the problem that no good contact is formed between the F line and the PAD of the chip under test DUT may be solved, and then it may be further determined whether good contact is formed between the S line and the PAD of the chip under test DUT.

The details of testing the open/short circuit condition of the diode in the first voltage drop branch of the second test apparatus are as follows::

When the relay K2 is turned on, a negative-phase driving current is provided by the F line, and the voltage drop detected by the F line is 0V (ground level), then in this regard, it is determined that good contact is formed between the F line, the S line and the PAD of the chip under test, and the diode D2 in the second test apparatus is in short circuit. If the voltage drop detected by the F line is the clamping voltage, it indicates that there is no good contact between the F line or the S line and the PAD of the chip under test or that the diode D2 in the second test apparatus has an open circuit condition. In this regard, it is preferable to determine whether good contact is formed between the S line, the F line and the PAD of the chip under test. For example, a multimeter is used to measure the resistance between the F line and the S line. If the measured resistance is infinite, it indicates that there is no good contact between the F line or the S line and the PAD of the chip under test. If the measured resistance is 0 ohms, it indicates that the F line and the S line are in good contact with the PAD. If it is determined that the F line, the S line are in good contact with the PAD of the chip under test, it is determined that the diode D2 in the second test apparatus is in short circuit.

Figure 3:
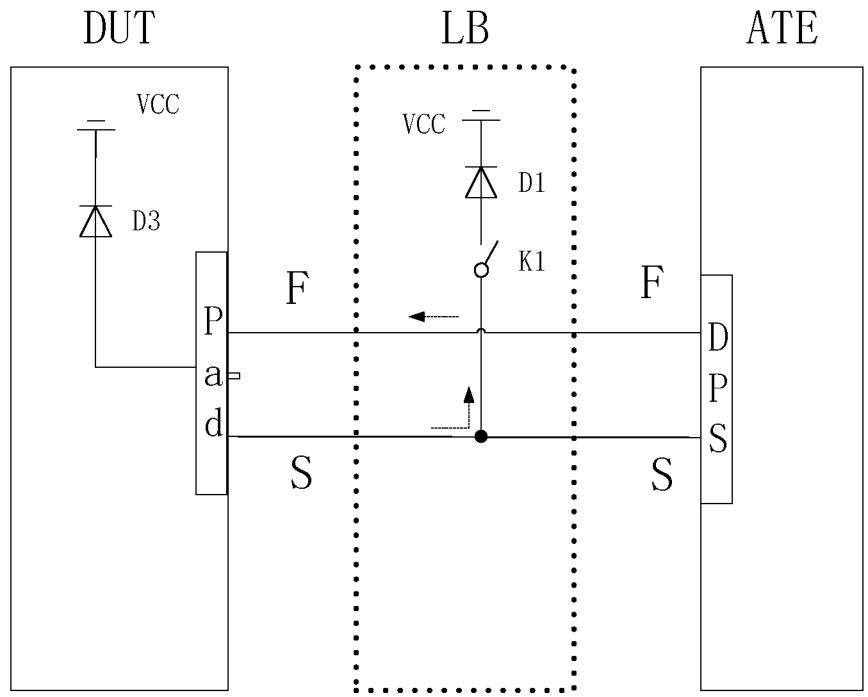
FIG. 3 is a schematic structural diagram of the test system according to Embodiment 3 of the present disclosure.

FIG. 3 is a schematic structural diagram of the test system according to Embodiment 3 of the present disclosure; in the present embodiment, an electrical connection effectiveness test is performed by providing a positive-phase driving current to the chip under test DUT by the device power supply DPS of the automated test equipment ATE. Correspondingly, the second test apparatus including only one first voltage drop branch (which includes diode D1 and relay K1), at the same time the chip under test DUT including one second voltage drop branch (which includes diode D3) is used as an example for description.

Specifically, as shown in FIG. 3, since the device power supply DPS of the automated test equipment ATE performs the electrical connection effectiveness test when providing the positive-phase driving current to the chip under test DUT, the cathode of the diode D1 in the first voltage drop branch is grounded, the anode of the diode D1 is connected to one end of the relay K1, at the same time, the other end of the relay K1 is connected to the S line; therefore, at the same time, the cathode of the diode in the second voltage drop branch is grounded and its anode is connected to the PAD of the chip under test DUT. Assume that there is no open or short circuit of the diode in the first voltage drop branch, the process is specifically as follows:

The positive-phase driving current is provided to the chip under test DUT by the device power supply (DPS) of the automated test equipment ATE, as shown in FIG. 3, since it is a positive-phase driving current, the current flow actually flows from the device power supply DPS of the automated test equipment ATE to the chip under test DUT, that is, as seen from the right to left arrow when viewed on the F line in FIG. 3; at the same time, the relay K1 in the second test apparatus is controlled by the automated test equipment ATE to be closed, therefore, if the S line is in good contact with the PAD of the chip under test DUT, it may turn on the diode and then a corresponding voltage drop may occur. In order to make the voltage drop detected on the F line be the voltage drop in the first test apparatus, when selecting the type, the diode D1 is preferable to select a diode, when turned on, having a voltage drop smaller than the voltage drop of the diode D3 in the chip under test DUT when turned on. In an actual application scenario, since the diode D3 in the second test apparatus is often a silicon diode (the voltage drop when turned on is about 0.6V), the diode D1 in the second test apparatus can be a germanium diode (the voltage drop when turned on is about 0.3V).

Further, if a voltage drop (corresponding to a diode-on voltage drop) can be detected on the F line, it indicates that the F line has good contact with the PAD of the chip under test DUT to further form an effective electrical connection, otherwise, it is a voltage drop corresponding to the turning on of a certain diode that cannot be detected through the F line, only the clamping voltage of the automated test equipment ATE can be detected.

Further, if the detected voltage drop is equal to the voltage drop of the germanium diode D1, it indicates that there is good contact between the S line and the PAD of the chip under test DUT to further form an effective electrical connection; if the detected voltage drop is equal to the voltage drop of the silicon diode, it indicates that there is no good contact between the S line and the PAD of the chip under test DUT and thus no effective electrical connection is formed. If the detected voltage drop is equal to the clamping voltage of the automated test equipment ATE, it indicates that good contact is not formed between the F line and the PAD of the chip under test DUT, and in this regard as to whether good contact is formed between the S line and the PAD of the chip under test DUT, it remains to be determined. For example, when it is shown that there is no good contact between the F line and the PAD of the chip under test DUT, first, the problem that no good contact is formed between the F line and the PAD of the chip under test DUT may be solved, and then it may be further determined whether good contact is formed between the S line and the PAD of the chip under test DUT.

If the detected voltage drop is equal to the voltage drop of the germanium diode D1, it indicates that there is good contact between the S line and the PAD of the chip under test DUT to further form an effective electrical connection, for a detailed description, please refer to FIG. 1.

On the contrary, when the diode D1 in the second test apparatus is selected to have a higher voltage drop when turned on than the voltage drop of the silicon diode in the chip under test DUT when turned on, regardless of whether the S line is in good contact with the PAD of the chip under test DUT, the voltage drop detected by the F line is the voltage drop of the silicon diode D3 in the chip under test DUT when turned on. In other words, whether the S line is in good contact with the PAD of the chip under test DUT may not cause a difference in the voltage drop detected by the F line, and further, it may not be possible to determine whether the S line is in good contact with the PAD of the chip under test DUT, for detailed reasons, please refer to the description of FIG. 1 described above.

The open/short circuit condition of the diode in the first voltage drop branch in the second test apparatus may be tested as follows:

When the relay K1 is turned off, a positive-phase driving current is provided through the F line, and the voltage drop detected by the F line is the voltage drop (about 0.6V) of the diode D3 in the second voltage drop branch, indicating that good contact is formed with the PAD of the chip under test DUT; then, when the relay K1 is turned on, the positive-phase driving current is provided through the F line, and the voltage drop detected by the F line is 0V (ground level), then in this regard, it is determined that the F line and the S line make good contact with the PAD of the chip under test and a short circuit in the diode D1 in the second test apparatus occurs. When the relay K1 is turned on, and the voltage drop detected by the F line is the voltage drop (about 0.6V) of the diode D3 in the second voltage drop branch, it indicates that there is no good contact formed between the S line and the PAD of the chip under test, or the diode D1 in the second test apparatus has an open circuit condition. In this regard, it is preferable to determine whether good contact is formed between the S line and the PAD of the chip under test. For example, a multimeter is used to measure the resistance between the F line and the S line. If the measured resistance is infinite, it indicates that there is no good contact between the F line or the S line and the PAD of the chip under test. If the measured resistance is 0 ohms, it indicates that the F line and the S line are in good contact with the PAD. If it is determined that the S line is in good contact with the PAD of the chip under test, it is determined that the diode D1 in the second test apparatus is in open circuit.

Figure 4:
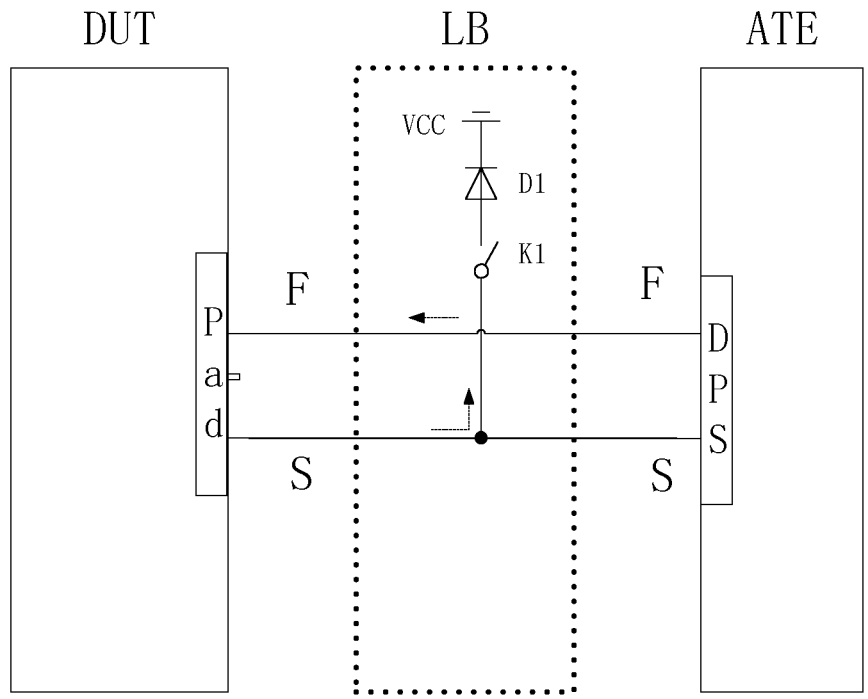
FIG. 4 is a schematic structural diagram of the test system according to Embodiment 4 of the present disclosure.

FIG. 4 is a schematic structural diagram of the test system according to Embodiment 4 of the present disclosure; in the present embodiment, an electrical connection effectiveness test is performed by providing a positive-phase driving current to the chip under test DUT by the device power supply DPS of the automated test equipment ATE. Correspondingly, the second test apparatus includes only one first voltage drop branch (which includes diode D1 and relay K1), however, unlike the embodiment in FIG. 3 described above, the chip under test DUT not including a second voltage drop branch is used as an example for description.

Specifically, as shown in FIG. 4, since the device power supply DPS of the automated test equipment ATE performs the electrical connection effectiveness test when providing the positive-phase driving current to the chip under test DUT, the cathode of the diode D1 in the first voltage drop branch is grounded, the anode of the diode D1 is connected to one end of the relay K1, at the same time, the other end of the relay K1 is connected to the S line. Assume that there is no open or short circuit of the diode in the first voltage drop branch, the process is specifically as follows:

The positive-phase driving current is provided to the chip under test DUT by the device power supply (DPS) of the automated test equipment ATE, as shown in FIG. 4, since it is a positive-phase driving current, the current flow actually flows from the device power supply DPS of the automated test equipment ATE to the chip under test DUT, that is, as seen from the right to left arrow when viewed on the F line in FIG. 4; at the same time, the relay K1 in the second test apparatus is controlled by the automated test equipment ATE to be closed, therefore, assume that the S line is in good contact with the PAD of the chip under test DUT, at the same time, if the voltage drop corresponding to the voltage drop of the diode can be detected on the F line, and the voltage drop corresponds to the voltage drop when the diode D2 in the second test apparatus is turned on, it just proves that the S line is in good contact with the PAD of the chip under test DUT, and the F line is in good contact with the PAD of the chip under test DUT, thereby forming the effective electrical connection. On the contrary, if the detected voltage drop is equal to the clamping voltage of the automated test equipment ATE, it indicates that good contact is not formed between the F line and the PAD of the chip under test DUT, and in this regard as to whether good contact is formed between the S line and the PAD of the chip under test DUT, it remains to be determined. For example, when it is shown that there is no good contact between the F line and the PAD of the chip under test DUT, first, the problem that no good contact is formed between the F line and the PAD of the chip under test DUT may be solved, and then it may be further determined whether good contact is formed between the S line and the PAD of the chip under test DUT.

The open/short circuit condition of the diode in the first voltage drop branch in the second test apparatus may be tested similarly to the above Embodiment 1. For details, please refer to the description of Embodiment 1 described above.

When the relay K1 is turned on, a positive-phase driving current is provided through the F line, and the voltage drop detected by the F line is 0V (ground level), then in this regard, it is determined that good contact is formed between the F line, the S line and the PAD of the chip under test, and the diode D1 in the second test apparatus has a short circuit. If the voltage drop detected by the F line is the clamping voltage, it indicates that there is no good contact between the F line or the S line and the PAD of the chip under test or that the diode D1 in the second test apparatus has an open circuit condition. In this regard, it is preferable to determine whether good contact is formed between the S line, the F line and the PAD of the chip under test. For example, a multimeter is used to measure the resistance between the F line and the S line. If the measured resistance is infinite, it indicates that there is no good contact between the F line or the S line and the PAD of the chip under test. If the measured resistance is 0 ohms, it indicates that the F line and the S line are in good contact with the PAD. If it is determined that the S line is in good contact with the PAD of the chip under test, it is determined that the diode D1 in the second test apparatus is in open circuit.

Figure 5:
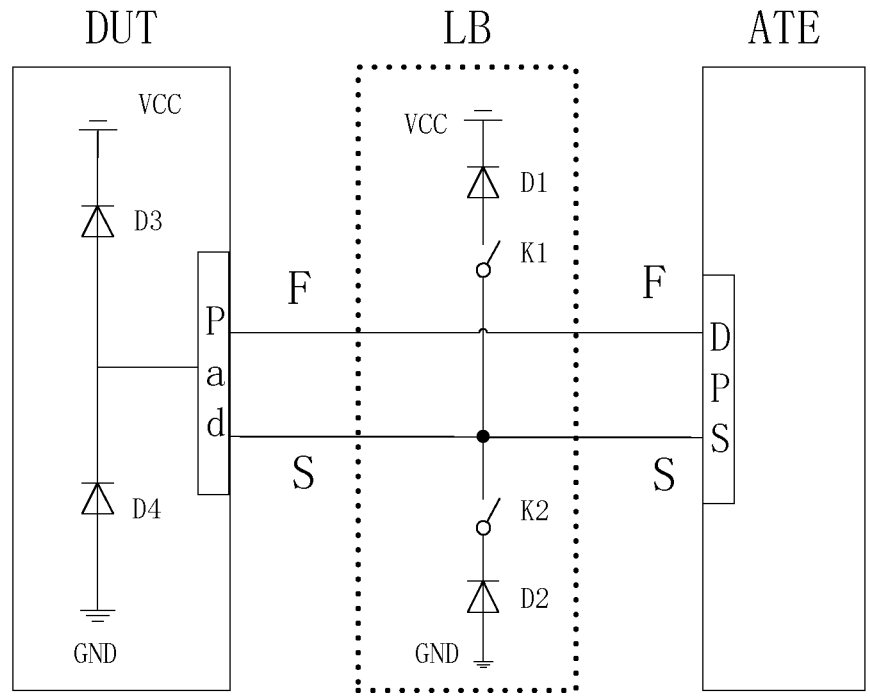
FIG. 5 is a schematic structural diagram of the test system according to Embodiment 5 of the present disclosure.

FIG. 5 is a schematic structural diagram of the test system according to Embodiment 5 of the present disclosure; as shown in FIG. 5, in the present embodiment, the second test apparatus includes two first voltage drop branches, in which the diode D2 and the relay K2 in one first voltage drop branch are connected as shown in FIG. 1, and the diode D1 and the relay K1 in the other first voltage drop branch are connected as shown in FIG. 3. Correspondingly, the chip under test DUT also includes two second voltage drop branches, in which the diode D4 in one second voltage drop branch is connected as shown in FIG. 1, and the diode D3 in the other second voltage drop branch is connected as shown in FIG. 3.

If an electrical connection effectiveness test is to be performed by providing a negative-phase driving current to the chip under test DUT by the device power supply DPS of the automated test equipment ATE, it may refer to FIG. 1. If an electrical connection effectiveness test is to be performed by providing a positive-phase driving current to the chip under test DUT by the device power supply DPS of the automated test equipment ATE, then it may refer to FIG. 3.

It can be seen that, in the present embodiment, a negative-phase driving current or a positive-phase driving current may be provided by the device power supply DPS to perform an electrical connection effectiveness test. Of course, in other embodiments, a negative-phase driving current, and a positive-phase driving current, or a positive-phase driving current, and a negative-phase driving current may also be provided successively, and the results of the two tests may be used to check each other.

The open/short circuit condition of the diode in the first voltage drop branch in the second test apparatus may be tested similarly to the above Embodiment 1. For details, please refer to the descriptions of Embodiment 1 and FIG. 3.

Figure 6:
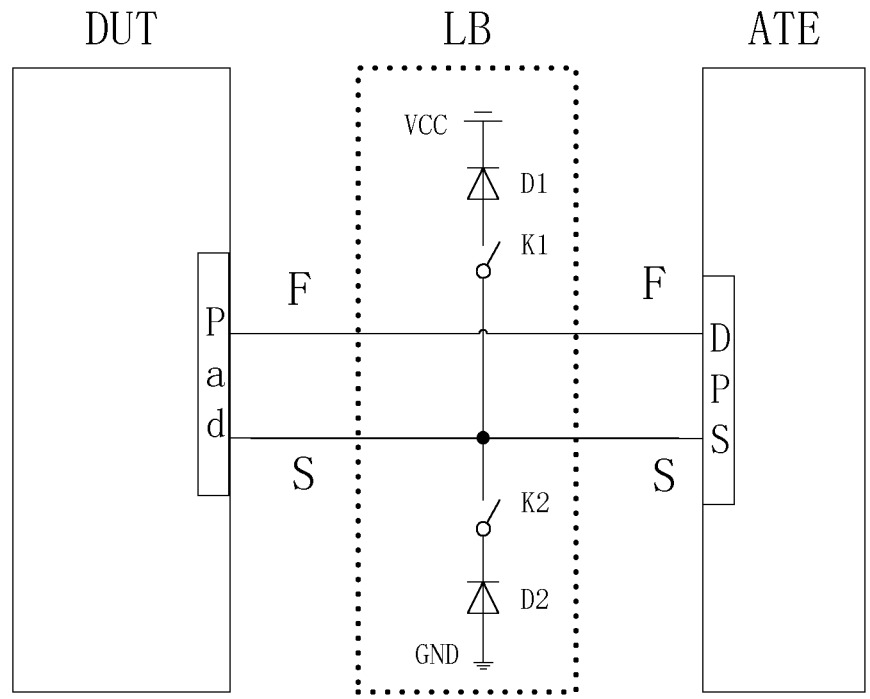
FIG. 6 is a schematic structural diagram of the test system according to Embodiment 6 of the present disclosure.

FIG. 6 is a schematic structural diagram of the test system according to Embodiment 6 of the present disclosure; as shown in FIG. 6, in the present embodiment, the second test apparatus includes two first voltage drop branches, in which the diode D2 and the relay K2 in one first voltage drop branch are connected as shown in FIG. 1, and the diode D1 and the relay K1 in the other first voltage drop branch are connected as shown in FIG. 3, and the chip under test DUT does not include a second voltage drop branch.

If an electrical connection effectiveness test is to be performed by providing a negative-phase driving current to the chip under test DUT by the device power supply DPS of the automated test equipment ATE, it may refer to FIG. 2. If an electrical connection effectiveness test is to be performed by providing a positive-phase driving current to the chip under test DUT by the device power supply DPS of the automated test equipment ATE, then it may refer to FIG. 4.

It can be seen that, in the present embodiment, a negative-phase driving current or a positive-phase driving current may be provided by the device power supply DPS to perform an electrical connection effectiveness test. Of course, in other embodiments, a negative-phase driving current, and a positive-phase driving current, or a positive-phase driving current, and a negative-phase driving current may also be provided successively, and the results of the two tests may be used to check each other.

The open/short circuit condition of the diode in the first voltage drop branch in the second test apparatus may be tested similarly to the above Embodiment 1. For details, please refer to the descriptions of Embodiment 2 and FIG. 4.

When it is determined through the above embodiments that an effective electrical connection is formed between the F line and the S line and the PAD of the chip under test DUT, the automated test equipment ATE may adjust the driving current transmitted through the F line according to the actual driving current detected by the S line, so that the actual driving current reaching the chip under test DUT meets the requirements for the normal operation of the device under test DUT.

In addition, it should be noted that, in the above embodiments, for the power supply pin VCC of the chip under test DUT, during the test, for the convenience of data viewing, its voltage may be configured to 0V. Here, the voltage drop detected by the F line corresponds directly to the voltage drop of the diode, such as 0.3V or 0.6V. However, in other embodiments, a certain driving voltage may be configured for the power pin VCC, such as 2.8V, then the voltage drop measured by the F line is the sum of the driving voltage and the corresponding diode voltage drop, such as 2.8V+0.3V=3.1V, or 2.8V+0.6V=3.4V. When the F line is not in good contact with the PAD of the chip under test, the voltage drop measured by the F line is the clamping voltage.

So far, specific embodiments of the present subject matter have been described. Other embodiments are within the scope of the appended claims. In some cases, the actions recited in the claims may be performed in a different order and still achieve the desired result. In addition, the processes depicted in the accompanying drawings do not necessarily require the particular order or sequential order shown to achieve the desired result. In some embodiments, multitasking and parallel processing may be advantageous.

Those skilled in the art should understand that the embodiments of the present disclosure may be provided as a method, a system, or a computer program product. Therefore, the present disclosure may take the form of an entirely hardware embodiment, an entirely software embodiment, or an embodiment combining software and hardware aspects. Moreover, the present disclosure may take the form of a computer program product implemented on one or more computer-usable storage mediums (including but not limited to disk memory, CD-ROM, optical memory, etc.) containing computer-usable program codes.

The present disclosure is described with reference to flowcharts and/or block diagrams of the method, device (system), and computer program product according to the embodiments of the present disclosure. It should be understood that each flow and/or block in the flowcharts and/or block diagrams, and combinations of flows and/or blocks in the flowcharts and/or block diagrams may be implemented by computer program instructions. These computer program instructions may be provided to a processor of a general-purpose computer, dedicated computer, embedded processor, or other programmable data processing device to produce a machine, such that instructions executed by the processor of the computer or other programmable data processing device produce an apparatus for implementing the functions specified in one or more flows in the flowcharts and/or one or more blocks in the block diagrams.

These computer program instructions may also be stored in a computer-readable memory capable of directing the computer or other programmable data processing device to work in a specific method such that the instructions stored in the computer-readable memory produce a product that includes an instruction apparatus that implements the functions specified in one or more flows in the flowcharts and/or one or more blocks in the block diagrams.

These computer program instructions may also be loaded onto the computer or other programmable data processing device, such that a series of operation steps may be performed on the computer or other programmable device to produce a computer-implemented process, such that the instructions executed on the computer or other programmable device provide steps for implementing the functions specified in one or more flows in the flowcharts and/or one or more blocks in the block diagrams.

In a typical configuration, a computing device includes one or more processors (CPUs), input/output interfaces, network interfaces, and memories.

Memory may include non-persistent memory, random access memory (RAM), and/or non-volatile memory in computer-readable medium, such as read-only memory (ROM) or flash read-only memory (flash RAM). Memory is an example of the computer-readable medium.

Computer-readable medium includes both permanent and non-persistent, removable and non-removable media. Information may be stored by any method or technology. Information may be computer-readable instructions, data structures, program modules, or other data. Examples of computer storage mediums include, but are not limited to, phase-change random access memory (PRAM), static random access memory (SRAM), dynamic random access memory (DRAM), other types of random access memory (RAM), read-only memory (ROM), electrically erasable programmable read-only memory (EEPROM), flash memory or other memory technologies, read-only disc read-only memory (CD-ROM), digital versatile disc (DVD) or other optical storage, magnetic tape cartridges, magnetic tape, magnetic disk storage or other magnetic storage devices, or any other non-transmission medium that may be used to store information that can be accessed by the computing device. As defined herein, the computer-readable medium does not include temporary computer-readable media (transitory media) such as modulated data signals and carrier waves.

It should also be noted that the terms "including," "comprising," or any other variation thereof are intended to encompass non-exclusive inclusion, such that a process, method, product, or device that includes a series of elements includes not only those elements but also other elements not explicitly listed, or those that are inherent to such process, method, product, or device. Without more restrictions, the elements defined by the sentence "including a test system" do not exclude the existence of other identical elements in the process, method, product or device including the said elements.

Those skilled in the art should understand that the embodiments of the present disclosure may be provided as a method, a system, or a computer program product. Therefore, the present disclosure may take the form of an entirely hardware embodiment, an entirely software embodiment, or an embodiment combining software and hardware aspects. Moreover, the present disclosure may take the form of a computer program product implemented on one or more computer-usable storage mediums (including but not limited to disk memory, CD-ROM, optical memory, etc.) containing computer-usable program codes.

The present disclosure may be described in the general context of computer-executable instructions executed by the computer, such as program modules. Generally, program modules include routines, programs, objects, components, data structures, etc. that perform specific transactions or implement specific abstract data types. The present disclosure may also be practiced in distributed computing environments in which transactions are performed by remote processing devices connected through communication networks. In a distributed computing environment, program modules may be located at local and remote computer storage mediums, including storage devices.

The embodiments in this specification are described in a progressive manner, and the same or similar parts between the embodiments may refer to each other. Each embodiment focuses on the differences from other embodiments. Specifically, for the system embodiment, since it is basically similar to the method embodiment, the description thereof is relatively simple. For relevant parts, it may refer to the description of the method embodiment.

The above description is merely embodiments of the present disclosure and is not intended to limit the present disclosure. For those skilled in the art, the present disclosure may have various modifications and changes. Any modification, equivalent replacement, improvement, etc. made within the spirit and principle of the present disclosure shall be included in the scope of the claims of the present disclosure.

What is claimed is:

1. A test system, comprising: a first test apparatus and a second test apparatus, wherein a device power supply of the first test apparatus is electrically connected with a device under test through a driving branch and a detecting branch, the driving branch being configured to provide an original driving current to the device under test by means of the device power supply during testing, and the detecting branch being configured to detect an effective driving current reaching the device under test; and the second test apparatus comprising a first voltage drop branch, the first voltage drop branch being connected to the detecting branch, and a voltage drop detected by the driving branch is used to determine an effectiveness of an electrical connection formed between the driving branch and the device under test, and an electrical connection formed between the detecting branch and the device under test.

2. The system according to claim 1, wherein the device under test comprises a second voltage drop branch and the original driving current is negative, when the voltage drop detected by the driving branch is a voltage drop of the first voltage drop branch, it is determined that an effective electrical connection is formed between the detecting branch and the device under test.

3. The system according to claim 2, wherein the first voltage drop branch comprises a first switching device and a second switching device, an anode of the first switching device is grounded, a cathode of the first switching device is connected to one end of the second switching device, and an other end of the second switching device is connected to the detecting branch.

4. The system according to claim 1, wherein the device under test comprises a second voltage drop branch and the original driving current is negative, when the voltage drop detected by the driving branch is a voltage drop of the second voltage drop branch in the device under test, it is determined that no effective electrical connection is formed between the detecting branch and the device under test.

5. The system according to claim 4, wherein the first voltage drop branch comprises a first switching device and a second switching device, an anode of the first switching device is grounded, a cathode of the first switching device is connected to one end of the second switching device, and an other end of the second switching device is connected to the detecting branch.

6. The system according to claims 5, wherein the first voltage drop branch comprises a first switching device and a second switching device, a cathode of the first switching device is grounded, an anode of the first switching device is connected to one end of the second switching device, and an other end of the second switching device is connected to the detecting branch.

7. The system according to claim 1, wherein the device under test comprises a second voltage drop branch and the original driving current is negative, when the voltage drop detected by the driving branch is a clamping voltage of the first test apparatus, it is determined that no effective electrical connection is formed between the driving branch and the device under test.

8. The system according to claim 7, wherein the first voltage drop branch comprises a first switching device and a second switching device, an anode of the first switching device is grounded, a cathode of the first switching device is connected to one end of the second switching device, and an other end of the second switching device is connected to the detecting branch.

9. The system according to claims 8, wherein the first voltage drop branch comprises a first switching device and a second switching device, a cathode of the first switching device is grounded, an anode of the first switching device is connected to one end of the second switching device, and an other end of the second switching device is connected to the detecting branch.

10. The system according to claim 1, wherein the device under test does not comprise a second voltage drop branch and the original driving current is negative, when the voltage drop detected by the driving branch is a clamping voltage of the first test apparatus, it is determined that no effective electrical connection is formed between the driving branch and the device under test, or no effective electrical connection is formed between the detecting branch and the device under test.

11. The system according to claim 10, wherein the first voltage drop branch comprises a first switching device and a second switching device, an anode of the first switching device is grounded, a cathode of the first switching device is connected to one end of the second switching device, and an other end of the second switching device is connected to the detecting branch.

12. The system according to claims 11, wherein the first voltage drop branch comprises a first switching device and a second switching device, a cathode of the first switching device is grounded, an anode of the first switching device is connected to one end of the second switching device, and an other end of the second switching device is connected to the detecting branch.

13. The system according to claim 1, wherein the device under test comprises a second voltage drop branch and the original driving current is positive, when the voltage drop detected by the driving branch is a voltage drop of the first voltage drop branch, it is determined that an effective electrical connection is formed between the detecting branch and the device under test.

14. The system according to claims 13, wherein the first voltage drop branch comprises a first switching device and a second switching device, a cathode of the first switching device is grounded, an anode of the first switching device is connected to one end of the second switching device, and an other end of the second switching device is connected to the detecting branch.

15. The system according to claim 1, wherein the device under test comprises a second voltage drop branch and the original driving current is positive, when the voltage drop detected by the driving branch is a voltage drop of the second voltage drop branch in the device under test, it is determined that no effective electrical connection is formed between the detecting branch and the device under test.

16. The system according to claim 1, wherein the device under test comprises a second voltage drop branch and the original driving current is positive, when the voltage drop detected by the driving branch is a clamping voltage of the first test apparatus, it is determined that no effective electrical connection is formed between the driving branch and the device under test.

17. The system according to claim 1, wherein the device under test does not comprise a second voltage drop branch and the original driving current is positive, when the voltage drop detected by the driving branch is a clamping voltage of the first test apparatus, it is determined that no effective electrical connection is formed between the driving branch and the device under test, or no effective electrical connection is formed between the detecting branch and the device under test.

18. The system according to claim 1, wherein the second test apparatus is provided on a loadBoard for building a function/performance test of a chip.

* * * * *